United States Patent
Örmin

(10) Patent No.: US 6,879,163 B2
(45) Date of Patent: Apr. 12, 2005

(54) DEVICE FOR THE AUTOMATIC CONTROL OF JOINTS IN ELECTRICAL HIGH VOLTAGE LINES

(75) Inventor: Jonas Örmin, Umeå (SE)

(73) Assignee: Vatten Fall AB, Stockholm (SE)

( * ) Notice: Subject to any disclaimer, the term of this patent is extended or adjusted under 35 U.S.C. 154(b) by 328 days.

(21) Appl. No.: 10/036,467

(22) Filed: Jan. 7, 2002

(65) Prior Publication Data

US 2004/0075440 A9 Apr. 22, 2004

Related U.S. Application Data

(63) Continuation of application No. PCT/SE00/01462, filed on Jul. 8, 2000.

(30) Foreign Application Priority Data

Jul. 9, 1999 (SE) ................................. 9902664

(51) Int. Cl.[7] .......................... G01R 31/08; G01R 19/00
(52) U.S. Cl. .......................................... 324/525; 702/64
(58) Field of Search ................................ 324/126, 525; 702/64

(56) References Cited

U.S. PATENT DOCUMENTS

| | | | |
|---|---|---|---|
| 4,709,339 A | 11/1987 | Fernandes | 364/492 |
| 4,818,990 A | 4/1989 | Fernandes | 340/870.07 |
| 4,904,996 A | 2/1990 | Fernandes | 340/870.07 |
| 5,663,718 A | 9/1997 | Segerström et al. | 349/870.07 |
| 5,806,180 A | 9/1998 | Segerström | 29/745 |
| 5,963,033 A | * 10/1999 | Booker | 324/240 |
| 6,512,536 B1 | * 1/2003 | Ross | 348/61 |

FOREIGN PATENT DOCUMENTS

WO        WO 94/04936        3/1994

* cited by examiner

*Primary Examiner*—N. Le
*Assistant Examiner*—Timothy J. Dole
(74) *Attorney, Agent, or Firm*—Robert Platt Bell

(57) ABSTRACT

A device for the automatic control of joints 5 in electrical high voltage lines is disclosed. It comprises a first support 1, a first wheel 2, for lying on a line 4, a driver for driving the first wheel 2, at least one second wheel 3 for lying on the line 4, a measurement unit 11, in contact with a device for measurement of physical data at the joint. The device includes at least one pointed element 7,8,9 for electrical contact with the line 4. The device is especially characterized in that at least one wheel 2,3 is provided electrically connected to the measurement unit.

12 Claims, 2 Drawing Sheets

DEVICE FOR THE AUTOMATIC CONTROL OF JOINTS IN ELECTRICAL HIGH VOLTAGE LINES

CROSS-REFERENCE TO RELATED APPLICATIONS

The present application is a Continuation Application of PCT application Ser. No. PCT/SE00/01462, filed on Jul. 8, 2000, which in turn claims priority from Swedish Patent Application Serial Number 99-2664-3, filed Jul. 9, 1999, both of which are incorporated herein by reference.

FIELD OF THE INVENTION

The present invention relates to a device for the automatic control of joints in electrical high voltage lines, comprising a first support, a first wheel for lying on a line, a driving means for driving of said first wheel, at least one second wheel for lying on said line, a measurement unit in contact with means for the measurement of physical data at said joint, comprising at least one pointed element for electrical contact with the line.

BACKGROUND OF THE INVENTION

Such devices are known, e.g., from Sergeström, U.S. Pat. No. 5,663,718, issued Sep. 2, 1997 and incorporated herein by reference, Patent Application PCT/SE93/00666, which discloses a device intended to be located on a line for electrical high voltage by a crane or helicopter. This device comprises a number of means for remotely controlled, automatic measurement of physical data at a joint in the line. The device shows, however, some limitations as to the measurement methods, as only pointed elements are provided for electrical measurements.

SUMMARY OF THE INVENTION

Thus, there is a demand for a device of the art mentioned introductorily, which enables more active measurement methods. According to the invention, such a device is primarily characterized in that at least one wheel is provided, electrically connected to said measurement unit. In one advantageous embodiment of the device, at least two wheels are provided, electrically connected to said measurement unit, whereas a means for feeding current is provided to feed an electrical current from the first wheel to the second wheel through the line.

In one alternative embodiment of the device, the means for measurement of physical data in the form of at least one pointed element (7,8,9) also comprises at least one wheel (2,3). In one advantageous embodiment of the device it comprises a retainer. journalled in the support, intended to be swung up below the line to increase the pressure of the wheel against same.

BRIEF DESCRIPTION OF THE DRAWINGS

In the following, the invention shall be described in more detail, reference being made to the three enclosed Figures, of which.

DETAILED DESCRIPTION OF THE INVENTION

Figure 1:
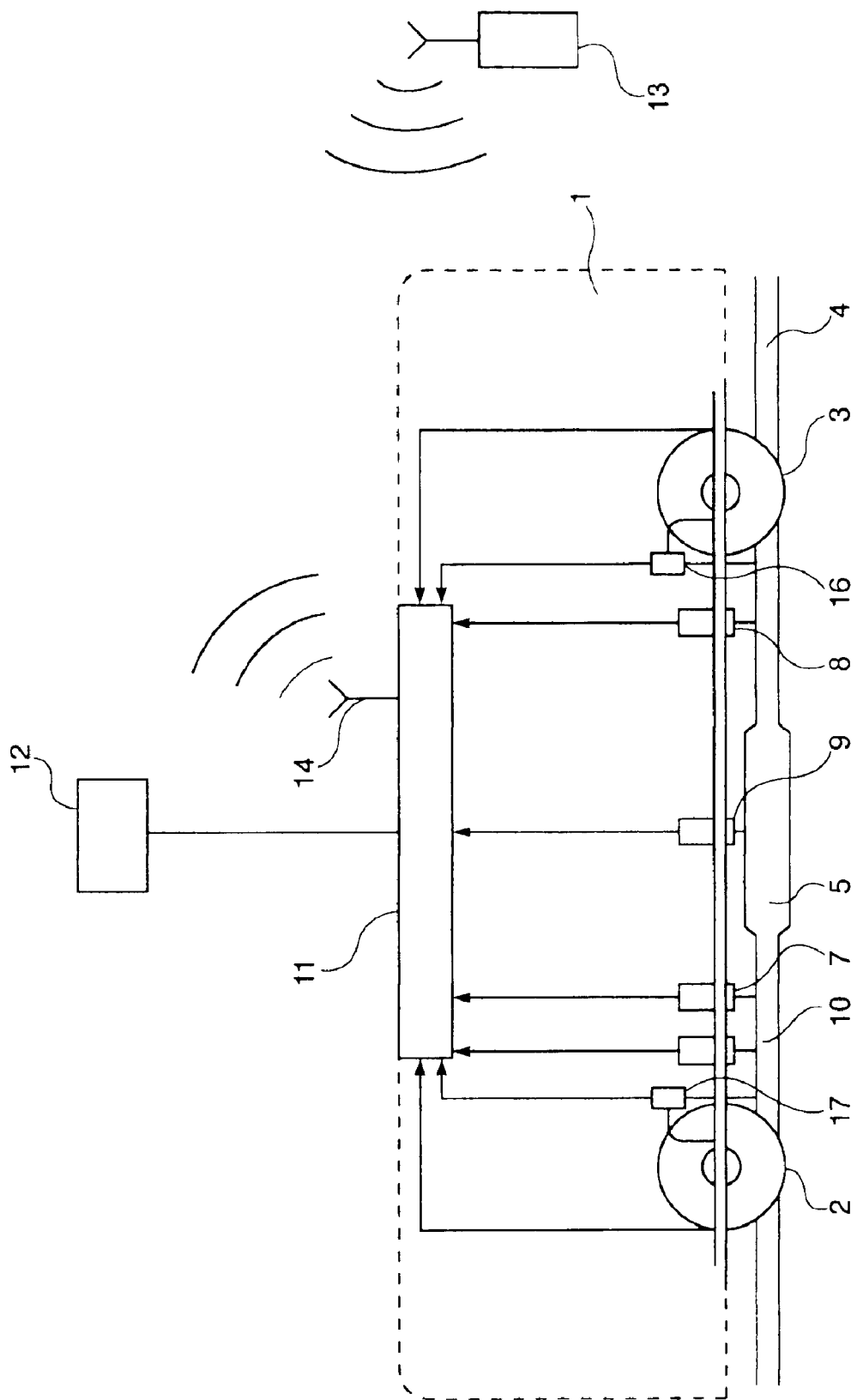
FIG. 1 is a schematic side view of one embodiment of the present invention.

In FIG. 1, a schematically indicated support is denoted by 1, a first wheel by 2, a second wheel by 3, and a line, against which these wheels lie, by 4. At least one of these wheels is provided with a driving device, which is not shown.

Figure 2:
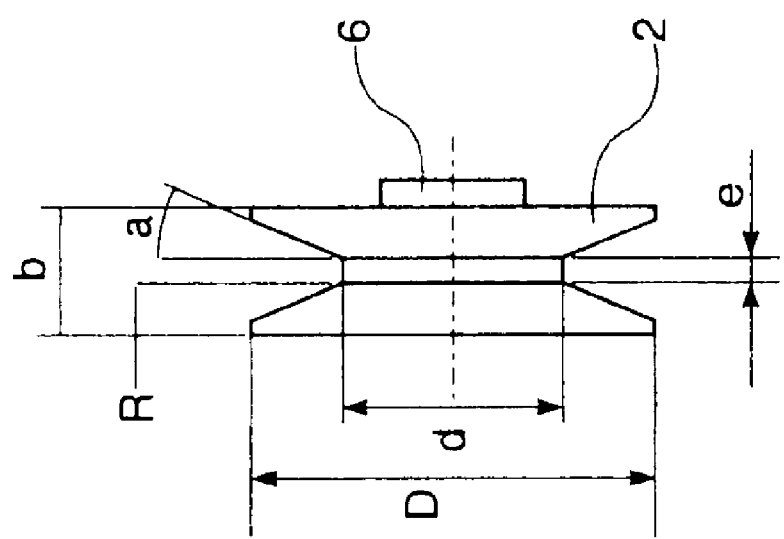
FIG. 2 is a sectional view of a wheel provided with a guide contact.

The line 4 is provided with a joint 5. Both wheels are provided with a glide contact 6, as illustrated in FIG. 2. The wheels are such designed, as to the outer diameter D, the inner diameter d, the outer width b, the inner free width e, the fillet radius R, and the opening angle $\alpha$, such that both the mechanical and electrical demands are fulfilled.

The included inner sides of the wheel flanges are suitably provided with structured surfaces, e.g., in the form of grooves or other surface form, in order to warrant good electrical contact with the line, when the wheels are used for feeding current, and also when they operate in the same way as the first, second, and third pointed element, which are marked by 7, 8, and 9. They are presented by springs for lying with good electrical contact with the line 4 and the joint 5.

A measurement pair of tongs are all connected to an electric measurement unit 11, which is also connected to an electric current feeding unit 12. The measurement unit 11 may be connected to a control station 13 via an optical fiber, an electric line, or wireless via an antenna 14, as indicated in FIG. 1. The pointed elements are, as is mentioned, provided for electrical contact with the line and joint, respectively. They also measure the temperature and transfer data of same to the measurement unit 11.

Figure 3:
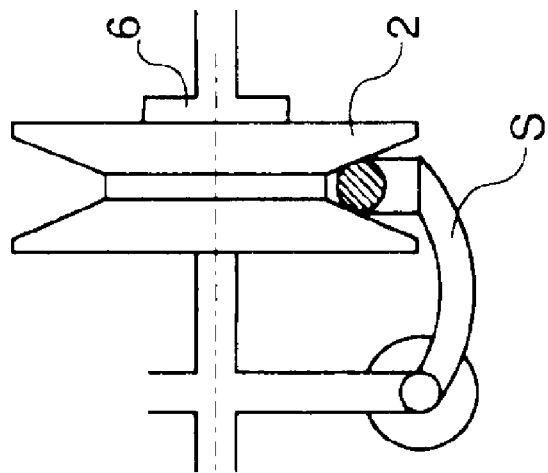
FIG. 3 is a schematic end view of a portion of the apparatus of FIG. 1, illustrating the swingable retainer.

The wheels may be used as pointed elements as well as for current feed. In FIG. 3 there is shown a retainer ("holder-on") S swingable in relationship to support 1, which retainer S is provided to press the wheel from below, when the wheel has come to lie at the line 4, to warrant electrical contact. Retainer S may also be used for transfer, together with wheel 2, current to line and joint 4,5 in order to get better current distribution in these.

The device is lifted to the actual line and shall first be positioned. For positioning of the device, including the joint, that shall be measured, and measuring the diameter of the line and the joint respectively, position indicators in the form of distance gauges are used, preferably of the laser type. In FIG. 1, they are marked by 16 and 17. Furthermore, here one not shown rotational position indicator is used for measurement of the rotation of the driving wheel or the driving wheels, i.e., traveled length on the line.

Principally, the positioning is carried out such that one operator drives the device forward on the line towards the actual joint. If, according to FIG. 1, the device is driven to the right, the position indicator 17 will be used for indicating when the left limit of the joint is achieved. The device is backed, and the length traveled is indicated by the rotational position indicator. The position indicator 16 indicates when it has reached the right limit. By the aid of the indicated data, the device is driven such that the joint will lie centrally within the device. The device may now be used, after positioning on the line for electrical high voltage, the joint of which shall be controlled, in different ways according to the following alternatives.

Alternative A—The measurement unit 11, wheel 2, line 4, with joint 5 and wheel 3, form a current circuit, within which a current of known amperage is made to circulate. The voltage drop between at least two measurement points, wheel 2, pointed elements 7,8,9 and wheel 3 is measured, as well as the temperature at the pointed elements 7,8, and 9.

Alternative B—The same current circuit as in alternative A is arranged, and a current with per se not known amperage is made to circulate in same, and the amperage in line 4 is measured with the measurement pair of tongs 10. Otherwise the same measurements are carried out as according to alternative A.

Alternative C—In this case the line 4 is fed with a current of known amperage. The voltage drop is measured between at least two of the measurement points, that are formed by the two wheels via their glide contacts and the pointed elements 7,8, and 9. Otherwise measurements are carried out according to alternative A.

Alternative D—The line 4 is here fed with a current of not known amperage. This is measured by the measurement pair of tongs 10, and otherwise it is measured according to alternative C.

Alternative E—In this case the line 4 is fed with a current of not known amperage. This is measured by the measurement pair of tongs 10 and the voltage drop is measured between a wheel via its guide contact and the pointed elements 7,8, and 9. Furthermore the temperature is measured at the pointed elements 7,8, and 9.

Within the scope of the invention, the device may be formed in several ways. Thus, the symmetry plane of the wheels, parallel to line 4, need not lie in the same plane. The means for physical measurement may also include such ones for the measurement in three dimensions of position in relationship to the line and the joint. The pointed elements may be placed above, at the side of, or below the line 4, also outside of the wheels. The pointed elements may be arranged such that they admit the measurement of the form of the joint and the bending, respectively. Their pressure against the line 4 is, as is mentioned, suitably adapted by springs. The device may of course be fitted with several different, here not shown sensors, and may also be equipped for remote control or more direct control, according to demand. The measurement pair of tongs may be placed optionally within or outside of the wheels.

While the preferred embodiment and various alternative embodiments of the invention have been disclosed and described in detail herein, it may be apparent to those skilled in the art that various changes in form and detail may be made therein without departing from the spirit and scope thereof.

I claim:

1. A device for the automatic control of joints in electrical high voltage lines, comprising:

a first support;

a first wheel for lying on the line;

a driving means for driving of said first wheel;

at least one second wheel, for lying on said line;

a measurement unit in contact with means for the measurement of physical data at said joint, said measurement unit comprising at least one pointed element for electrical contact with the line, wherein at least one of said first and second wheels is provided electrically connected to said measurement unit.

2. The device according to claim 1, wherein the means for measurement of physical data in the form of one pointed element also comprise at least one of said first and second wheels.

3. The device according to claim 2, further comprising:

a retainer, journalled in the support so as to be swung up below the line to increase pressure of at least one of the first wheel and second wheel against the line so as to improve electrical contact between the wheel and the line.

4. The device according to claim 3, further comprising:

measurement indicators for measurement of the position of the device in relationship to the actual joint.

5. The device according to claim 4, wherein the measurement indicator comprises a laser distance gauge.

6. The device according to claim 2, further comprising:

measurement indicators for measurement of the position of the device in relationship to the actual joint.

7. The device according to claim 6, wherein the measurement indicator comprises a laser distance gauge.

8. The device according to claim 1, further comprising:

a retainer, journalled in the support so as to be swung up below the line to increase pressure of the wheel against the line.

9. The device according to claim 8, further comprising:

measurement indicators for measurement of the position of the device in relationship to the actual joint.

10. The device according to claim 9, wherein the measurement indicator comprises a laser distance gauge.

11. The device according to claim 1, further comprising:

measurement indicators for measurement of the position of the device in relationship to the actual joint.

12. The device according to claim 11, wherein the measurement indicator comprises a laser distance gauge.

* * * * *